US011431369B2

United States Patent
Oster et al.

(10) Patent No.: US 11,431,369 B2
(45) Date of Patent: Aug. 30, 2022

(54) SELF-CALIBRATED MULTI-CHANNEL TRANSMISSION SYSTEM FOR A SATELLITE PAYLOAD

(71) Applicant: THALES, Courbevoie (FR)

(72) Inventors: Yann Oster, Toulouse (FR); Aubin Michel Lecointre, Toulouse (FR); Aline Briand, Toulouse (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 17/283,520

(22) PCT Filed: Oct. 7, 2019

(86) PCT No.: PCT/EP2019/077052
§ 371 (c)(1),
(2) Date: Apr. 7, 2021

(87) PCT Pub. No.: WO2020/074428
PCT Pub. Date: Apr. 16, 2020

(65) Prior Publication Data
US 2021/0391882 A1   Dec. 16, 2021

(30) Foreign Application Priority Data

Oct. 11, 2018  (FR) .................................. 1801072

(51) Int. Cl.
*H04B 1/12* (2006.01)
*H03F 1/04* (2006.01)
(Continued)

(52) U.S. Cl.
CPC .............. *H04B 1/126* (2013.01); *H03F 1/04* (2013.01); *H03F 1/3247* (2013.01);
(Continued)

(58) Field of Classification Search
CPC ... H04B 1/126; H04B 2001/0433; H03F 1/04; H03F 1/3247; H03F 1/3282; H03F 3/602;
(Continued)

(56) References Cited

U.S. PATENT DOCUMENTS 5,631,604 A * 5/1997 Dent ..................... H03F 1/3229
330/149
5,783,969 A * 7/1998 Luz .......................... H03F 1/52
330/207 P (Continued)

FOREIGN PATENT DOCUMENTS

EP   2 383 887 A1   11/2011
EP   2 800 271 A1   11/2014

OTHER PUBLICATIONS

Lee, et al., "Analysis of multi-port amplifier calibration for optimal magnitude and phase detection", IET Microwaves, Antennas & Propagation, vol. 10, Issue 1, pp. 102-110, 2016.

*Primary Examiner* — Jinsong Hu
*Assistant Examiner* — Rui M Hu
(74) *Attorney, Agent, or Firm* — BakerHostetler

(57) ABSTRACT

A multichannel transmission system which includes a calibration functionality that allows precise calibration of the frequency conversion chains and of the multiport amplifier of the system to be performed without interruption of service. The proposed calibration makes it possible to correct the defects over the entire frequency band of the system.

10 Claims, 9 Drawing Sheets

(51) Int. Cl.
*H03F 1/32* (2006.01)
*H03F 3/60* (2006.01)
*H03F 3/68* (2006.01)
*H04B 1/04* (2006.01)

(52) U.S. Cl.
CPC .......... *H03F 1/3282* (2013.01); *H03F 3/602* (2013.01); *H03F 3/68* (2013.01); *H03F 2200/192* (2013.01); *H03F 2200/451* (2013.01); *H03F 2201/3212* (2013.01); *H04B 2001/0433* (2013.01)

(58) Field of Classification Search
CPC ................ H03F 3/68; H03F 2200/192; H03F 2200/451; H03F 2201/3212; H03F 2200/204; H03F 3/24
See application file for complete search history.

(56) References Cited

U.S. PATENT DOCUMENTS

| | | | | |
|---|---|---|---|---|
| 5,834,972 | A * | 11/1998 | Schiemenz, Jr. | H03F 3/602 330/286 |
| 6,006,111 | A * | 12/1999 | Rowland | H01Q 3/267 330/124 R |
| 6,624,784 | B1 * | 9/2003 | Yamaguchi | H04B 17/20 342/383 |
| 7,245,257 | B1 * | 7/2007 | Bruce | H01P 5/12 342/372 |
| 7,965,136 | B2 * | 6/2011 | Rhodes | H03F 3/602 330/124 R |
| 8,618,878 | B2 * | 12/2013 | Hangai | H03F 3/24 330/84 |
| 8,761,694 | B2 * | 6/2014 | Lorenz | H04B 1/0483 455/127.2 |
| 9,793,871 | B1 * | 10/2017 | Kim | H04B 1/04 |
| 10,447,219 | B2 * | 10/2019 | Wu | H03F 1/0205 |
| 10,624,051 | B2 * | 4/2020 | Roukos | H04L 43/50 |
| 2004/0222849 | A1 * | 11/2004 | Doi | H03F 3/602 330/124 R |
| 2004/0228422 | A1 * | 11/2004 | Silveira | H03F 1/3241 375/299 |
| 2005/0219118 | A1 * | 10/2005 | Kubo | H01Q 3/267 342/174 |
| 2007/0139104 | A1 * | 6/2007 | Yuan | H03F 3/72 330/124 D |
| 2010/0166109 | A1 * | 7/2010 | Neumann | H04L 27/368 375/296 |
| 2010/0254299 | A1 * | 10/2010 | Kenington | H04B 7/063 375/296 |
| 2010/0254441 | A1 * | 10/2010 | Kenington | H03F 1/3282 375/296 |
| 2011/0267141 | A1 * | 11/2011 | Hangai | H03F 3/24 330/84 |
| 2012/0163428 | A1 * | 6/2012 | Shin | H03F 3/602 375/219 |
| 2012/0280748 | A1 * | 11/2012 | Tranche | H03F 3/24 330/124 R |
| 2012/0319772 | A1 * | 12/2012 | Chang | H03F 1/3247 330/124 R |
| 2012/0319885 | A1 * | 12/2012 | Chang | H03F 3/211 341/155 |
| 2015/0249462 | A1 * | 9/2015 | Chang | H04J 14/0227 398/43 |
| 2017/0005894 | A1 | 1/2017 | Roukos et al. | |
| 2017/0026006 | A1 * | 1/2017 | Roukos | H03F 1/0205 |
| 2017/0070308 | A1 * | 3/2017 | Hahn, III | H04J 3/1694 |
| 2018/0183397 | A1 | 6/2018 | Wu et al. | |
| 2018/0248570 | A1 * | 8/2018 | Camuffo | H03F 1/0266 |
| 2019/0131934 | A1 * | 5/2019 | Khalil | H03F 3/189 |
| 2019/0173443 | A1 * | 6/2019 | Elwailly | H04B 17/21 |
| 2019/0319719 | A1 * | 10/2019 | McGowan | H01Q 3/267 |
| 2020/0136706 | A1 * | 4/2020 | Lv | H04B 7/0686 |
| 2020/0322209 | A1 * | 10/2020 | Zhang | H04L 27/38 |

* cited by examiner

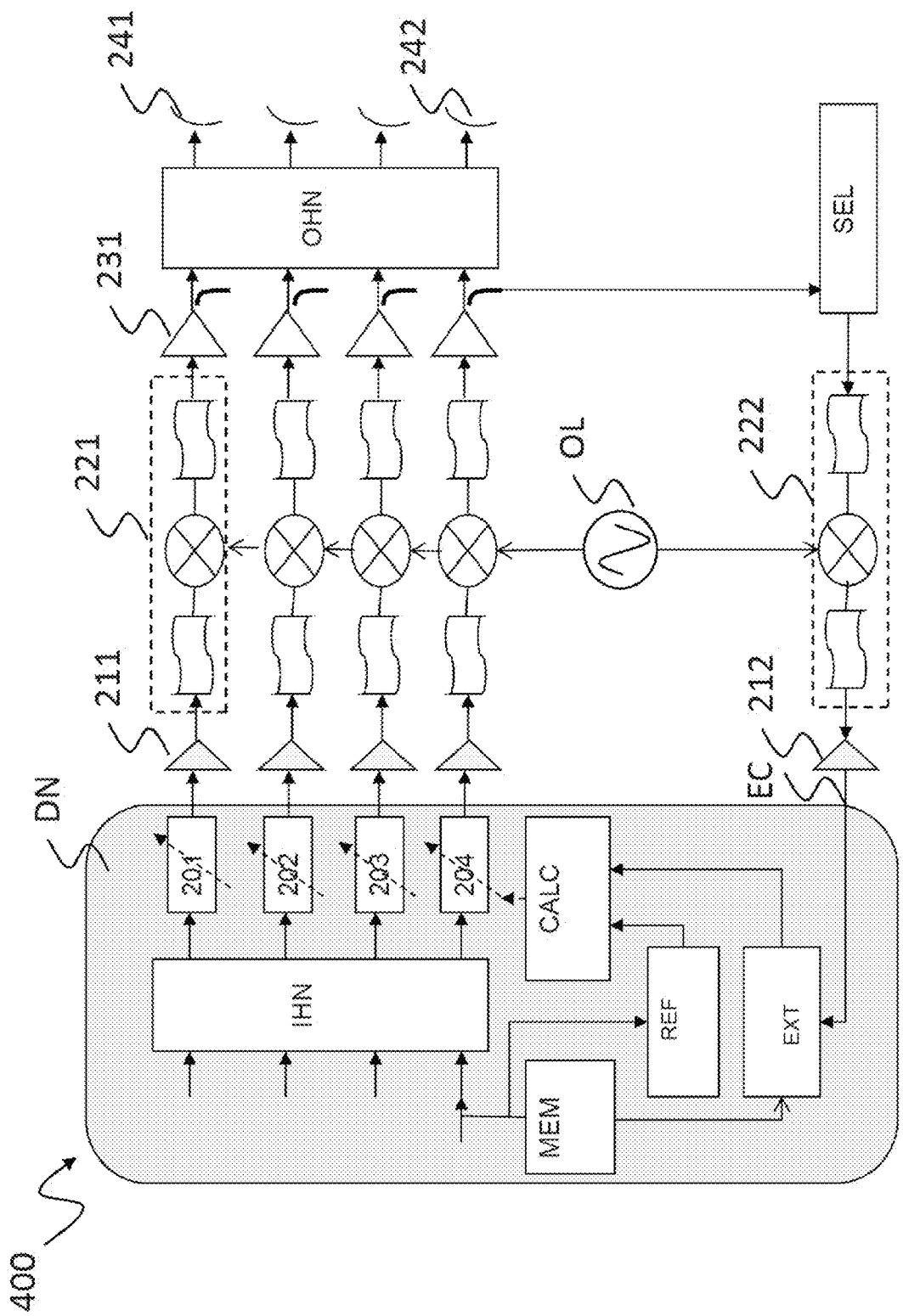

SELF-CALIBRATED MULTI-CHANNEL TRANSMISSION SYSTEM FOR A SATELLITE PAYLOAD

CROSS-REFERENCE TO RELATED APPLICATIONS

This application is a National Stage of International patent application PCT/EP2019/077052, filed on Oct. 7, 2019, which claims priority to foreign French patent application No. FR 1801072, filed on Oct. 11, 2018, the disclosures of which are incorporated by reference in their entirety.

FIELD OF THE INVENTION

The invention relates to the field of the calibration of radiofrequency transmission chains and of the calibration of multichannel or multiport amplifiers particularly, but not exclusively, for the beamforming of antennas in a satellite payload.

BACKGROUND

The subject of the invention is a multichannel transmitter system comprising such a multiport amplifier and which comprises an integrated calibration functionality in order to correct defects in the frequency responses of the chains for radiofrequency transmission, in order to pair them so as to optimize isolation between channels of the system.

The general problem targeted by the invention relates to the correction of defects between different channels of a multichannel transmission system comprising, for each channel, a radiofrequency processing chain comprising at least one filter and one frequency transposition, and one multiport amplifier. The defects to be corrected are defects that affect the frequency responses of the radiofrequency transmission chains, the pairing of these chains with one another, and isolation defects in the multiport amplifier.

Such a multichannel transmission system requires precise calibration of all of the channels in order to correct phase shifts and differences in gain over the entire useful frequency band, which affect the signals at the output of each channel. These defects arise from defects inherent to analog components which are not all strictly identical and which do not exhibit the same behavior with temperature, aging or exposure to ionizing radiation.

A multiport amplifier is composed of an input hybrid network and an output hybrid network, the transfer functions of which must be reciprocal. Regardless of the RF technology used to produce the hybrid networks, it is very difficult to ensure perfect reciprocity of the transfer functions. Thus, isolation errors also arise from manufacturing defects in these components. Isolation defects in a multiport amplifier also arise from pairing defects in the elementary amplifiers.

In addition, isolation defects are not necessarily identical throughout the useful frequency band of the system. These isolation defects generate, on the one hand, signal leakages between the different output ports and, on the other hand, amplification losses.

There is therefore a need to dynamically calibrate, without interruption of service, a set of radiofrequency chains for transmission using a multiport amplifier, in order to precisely pair the channels with one another and to correct isolation defects in the multiport amplifier.

Various solutions exist for correcting defects in the frequency responses of radiofrequency transmission chains and isolation defects between channels of a multiport amplifier.

A first solution consists in overconstraining the specification for each component or item of equipment in the processing chain, so that the sum of the dispersions of all of the components remains compatible with the desired level of performance, for the envisaged mission. In other words, the components of the system are designed with low tolerance ranges or margins.

This technique does not perform calibration and has the drawback of significantly increasing the design costs of the system. Moreover, since residual dispersions are not compensated for dynamically, they may change over time and thus remain non-negligible.

Another solution consists in characterizing the behavior of the components or equipment of the system, in terms of sensitivity to temperature and/or to the supply voltage or to other parameters, and then in implementing a function for statically compensating for defects according to these parameters. This type of calibration allows static correction based on the measurement or on the estimation of these parameters, without the ability to adapt to the actual deviations which may change, in particular due to aging and the effect of radiation.

Another solution consists in estimating the differences in the frequency responses on the different radiofrequency transmission chains, using a well-controlled calibration signal, injected at the input of the system and extracted at the output. The deformation in the calibration signal at the output of the chain makes it possible to estimate the spectral response in real time, and to compensate for defects by means of a feedback loop. This type of looped, dynamic solution makes it possible to adapt to defects in the frequency responses, independently of their origin.

However, this solution requires the ability to inject and extract the measurement signal for calibration.

A first option consists in interrupting the service provided by the system, for example a telecommunications service, during the calibration in order to generate a calibration signal. This solution has the drawback of interrupting the service.

A second option consists in decreasing the power of the calibration signal in order to superpose it onto the useful signal in an imperceptible manner, to avoid interruption of the service. In this case, the measurement of the extracted calibration signal is affected by a low signal-to-noise ratio, limiting calibration precision.

A third option consists in spreading the spectrum of the calibration signal in order to superimpose it onto the useful signal in an imperceptible manner, in order to avoid interruption of the service. In this case, the measurement of the extracted calibration signal is affected by an average signal-to-noise ratio and by the spreading of frequency resolution. The defect estimate corresponds to an average of the defects over the frequency spreading band, limiting the frequency resolution of the calibration.

A fourth solution consists in transmitting the calibration signal on frequencies not used by the service, in order to avoid interference between the calibration signal and the useful signals. This solution makes it possible to perform precise measurements with a good signal-to-noise ratio of the calibration signal, but with poor frequency resolution, since the calibration signal does not cover the entire useful frequency band.

Another solution, described in European patent application EP2383887 consists, for a multiport amplifier provided with couplers on all of the outputs of the output hybrid network, in generating signals with different particular frequencies on the various inputs of the amplifier in order to estimate the gain and phase disparities according to the frequency and on the different channels. This technique imposes a traffic interruption during calibration. A specific calibration signal is injected over all of the inputs of the input network of the amplifier.

The solution described in European patent application EP2800271 is also known. This solution consists in adaptively compensating each unitary amplifier of a multiport amplifier with one gain and phase control point per amplifier, so as to minimize intercorrelation between the different output signals of the amplifier. A digital processor performs the correlation processing on two acquisition chains selecting pairs of outputs of the multiport amplifier. This solution may be used without interrupting traffic, provided that the different signals to be transmitted are decorrelated, which is not generally the case, in particular when an active antenna is used at the output of the amplifier. In addition, this technique does not cover the compensation for isolation errors over a wide frequency band and does not compensate for defects in the frequency responses of the frequency conversion chains.

The scientific publication "Analysis of multi-port amplifier calibration for optimal magnitude and phase detection" (Han Lim Lee et al.) is also known, which distinguishes between the calibration devices for multiport amplifiers according to the position of the measurement couplers at the input or at the output of the output hybrid network. Calibration is performed in the absence of traffic. The compensation for pairing defects in the elementary amplifiers of the multiport amplifier is performed by an analog amplifier and by an analog phase-shifter, for a single frequency, on command by a computing unit. This technique imposes interruption of service, it does not make it possible to correct isolation defects over the entire useful frequency band of the system, and does not cover the calibration of the radiofrequency chains.

A self-calibrated amplifier of the type described in the American patent application by the applicant, US 2012/0280748, is also known. This solution consists in injecting a calibration signal over an input channel of the amplifier by superposing it onto the useful signal. The proposed method does not take into account the distortions between the frequency responses of the conversion chains. Since the calibration signal is not removed at the output of the amplifier, it is therefore radiated and must be discrete, which imposes a low signal-to-noise ratio on this signal or the use of spectrum spreading. Isolation defects are only corrected for a single frequency and do not allow correction over the entire frequency band of the useful signal.

In general, the known solutions involve interruption of the service provided by the multichannel transmission system, for example a telecommunications service.

Some solutions allow calibration without interruption of service but involve a decrease in calibration precision due to a low signal-to-noise ratio of the calibration signal or due to a low frequency resolution for the defect estimate. The known calibration solutions for radiofrequency chains and for multiport amplifiers, without interruption of service, result in the transmission of the calibration signal which is liable to interfere with the useful signals.

The invention allows the drawbacks of the solutions mentioned above to be overcome by providing a multichannel transmission system which includes a calibration functionality that allows precise calibration of the frequency conversion chains and of the multiport amplifier of the system to be performed without interruption of service. The proposed calibration makes it possible to correct the defects over the entire frequency band of the system.

SUMMARY OF THE INVENTION

One subject of the invention is a multichannel transmission system comprising a digital device configured to implement a multiple-input, multiple-output input hybrid network and a distinct equalization filter for each output of the input hybrid network, the system further comprising:
  for each output of the digital device, a digital-to-analog converter followed by a radiofrequency analog processing chain, comprising at least one analog filter, and by an amplifier,
  an output hybrid network, each input of which is connected to the output of an amplifier,
  a radiofrequency analog acquisition chain comprising at least one analog filter connected on the one hand, alternately, to the output of each amplifier via a selector, and on the other hand to a calibration input of the digital device via an analog-to-digital converter,
the digital device being further configured to:
  generate a calibration signal on an input of the input hybrid network, extract, from the signal received on the calibration input, a measurement of the calibration signal,
  successively determine the response of each equalization filter so as to minimize a difference between the generated calibration signal and the measured calibration signal, the selector being connected successively to the output of each amplifier or to each successive output of the output hybrid network.

According to one particular aspect of the invention, the input hybrid network is configured to receive the calibration signal on a calibration input and a useful signal on the other inputs and the output hybrid network comprises a calibration output connected to a load and the other outputs connected to one or more antennas.

According to one particular aspect of the invention, the calibration signal is superposed onto a useful signal on an input of the input hybrid network.

According to one particular aspect of the invention, the calibration signal occupies the entire spectral band of the system.

According to one particular aspect of the invention, the calibration signal is a wideband signal or a narrowband signal having a frequency band that varies with time throughout the entire frequency band of the system.

According to one particular aspect of the invention, the calibration signal is periodic and the extraction of a measurement of the calibration signal is achieved by performing a coherent temporal accumulation of the signal received on the calibration input.

According to one particular aspect of the invention, the calibration signal is equal to a useful signal generated on an input of the input hybrid network and saved in a memory.

According to one particular aspect of the invention, each equalization filter is configured to correct, over the entire frequency band of the system, the output signals of the input hybrid network in terms of amplitude and of phase so as to correct the pairing and isolation defects in the different channels of the multichannel transmission system.

According to one particular aspect of the invention, the transfer function of the input hybrid network is determined so as to be the inverse of the transfer function of the output hybrid network.

According to one particular aspect of the invention, each radiofrequency analog processing chain comprises a frequency transposition device for transposing the analog signal from a first frequency to a second frequency and the radiofrequency analog acquisition chain comprises an inverse frequency transposition device for transposing an analog signal from the second frequency to the first frequency.

Another subject of the invention is a satellite payload comprising a multichannel transmission system according to the invention and at least one antenna or antenna array connected at the output of said system.

BRIEF DESCRIPTION OF THE DRAWINGS

Other features and advantages of the present invention will become more apparent from reading the description which follows in relation to the appended drawings, which show.

DETAILED DESCRIPTION

Figure 1:
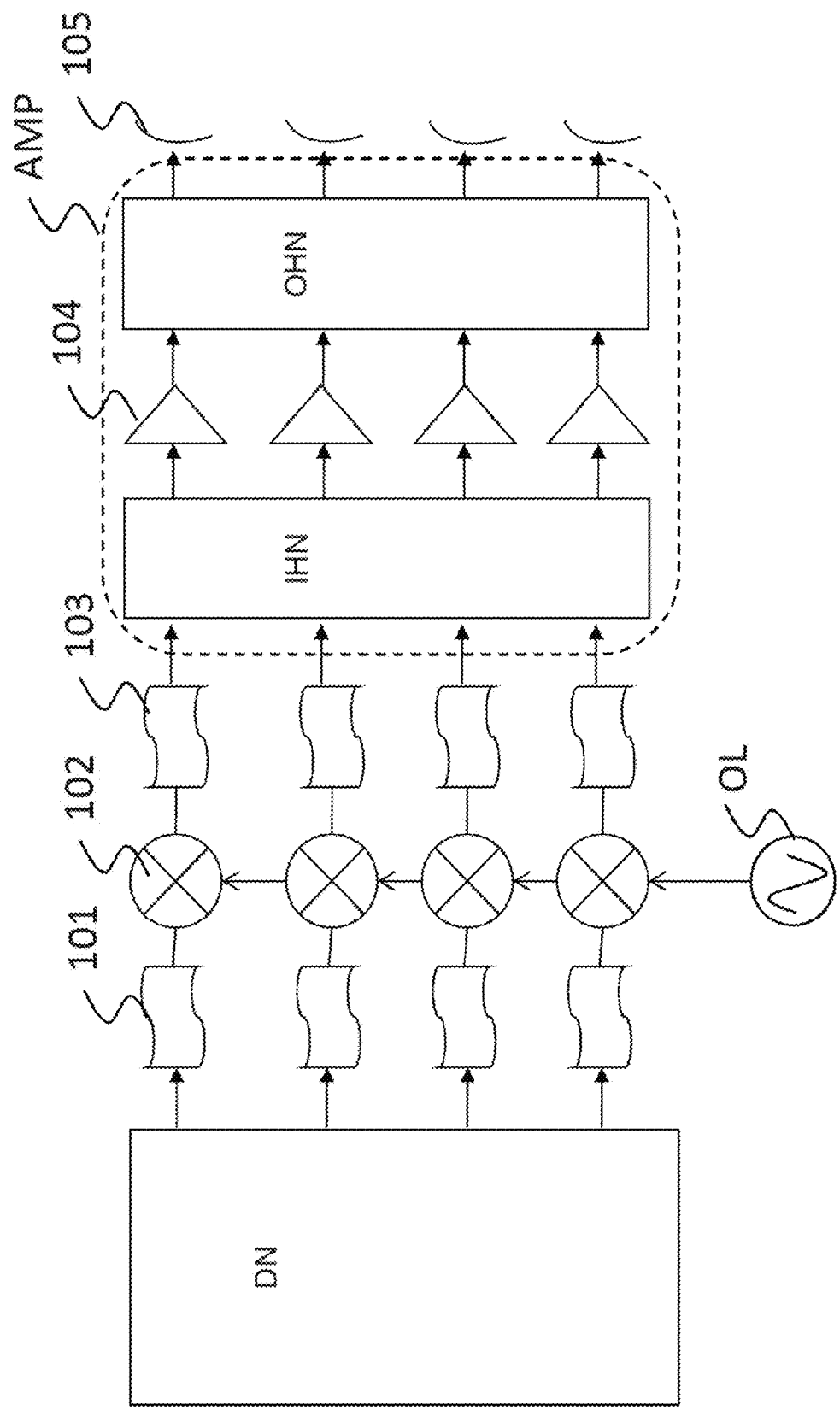
FIG. 1, a diagram of a multichannel transmission system with multiport amplifier according to the prior art, FIG. 2a, a diagram of a multichannel transmission system with multiport amplifier according to a first embodiment of the invention, FIGS. 2b, 2c and 2d, three diagrams showing variants of the system of FIG. 2a, FIG. 3, a block diagram illustrating the implementation of an optimization algorithm in the time domain for the calculation of the coefficients of an equalization filter, FIG. 4, a block diagram illustrating the implementation of an optimization algorithm in the frequency domain for the calculation of the coefficients of an equalization filter, FIG. 5, a diagram of a multichannel transmission system with multiport amplifier according to a second embodiment of the invention, FIG. 6, a diagram of a multichannel transmission system with multiport amplifier according to a third embodiment of the invention.

FIG. 1 shows an exemplary multichannel transmission system with multiport amplifier of the prior art. Such a system comprises a digital device DN for generating or processing digital signals originating from a user, from a ground station or from another satellite. The digital signals are converted to analog by one or more digital-to-analog converters (not shown in FIG. 1). The system of FIG. 1 comprises a plurality of radiofrequency transmission channels (four channels in the example described). For each of the radiofrequency transmission channels, an analog frequency conversion chain allows the signal to be filtered and the signal to be transposed to a transmission carrier frequency. Such a frequency conversion chain comprises one or more analog filters 101, 103 and a mixer 102. The analog signals are then produced at the input of a multiport amplifier AMP for power amplification.

A multiport amplifier AMP is a structure that makes it possible to share a set of N elementary amplifiers in order to amplify a set of N signals entering over N input ports and exiting, after amplification, over N output ports. In ideal operation, isolation of the signals is ensured on the output ports. The structure of a multiport amplifier consists of an input hybrid network IHN, a set of paired elementary amplifiers 104, and an output hybrid network OHN.

A hybrid network is a multiplexing device that receives a plurality of signals on its multiple inputs and applies a rule for phase-shifting and combining the input signals to produce the same number of output signals. In other words, each output signal of the IHN hybrid network is equal to a complex linear combination of the input signals phase-shifted according to a given phase law. The hybrid network applies a special transfer function to the input signals. It may take the form, for example, of a Butler matrix. An elementary amplifier 104 is connected to each output of the input hybrid network IHN. Next, an output hybrid network OHN is placed after the amplifiers in order to apply the inverse transfer function with respect to that of the input hybrid network IHN. The multiport amplifier AMP allows fine management of the allocation of power to each channel of the system. For example, the entirety of the maximum power of the four amplifiers may be allocated to a single channel, which would not be possible with one elementary amplifier per channel.

At the output of the multiport amplifier AMP, one or more antennas 105 are arranged so as to radiate the amplified signals. They may be passive antennas, each antenna comprising a source, for example a horn, excited by a signal from a channel of the system so as to form a beam. In this case, the transmission system comprises an antenna for each channel, each antenna being connected to an output of the multiport amplifier. Passive antennas may also be replaced with an active antenna or an antenna array which comprises a plurality of sources that radiate in parallel and are excited by all of the output signals of the multiport amplifier according to a phase law that makes it possible to form a plurality of beams in a plurality of directions. In the case of an active antenna, all of the frequency transposition chains use the same local oscillator in order to ensure the phase coherence of the signals after their frequency transposition.

The system of FIG. 1 has the drawbacks, already discussed, of defects in the frequency responses of the radiofrequency chains and of isolation defects between the different channels.

Figure 2A:
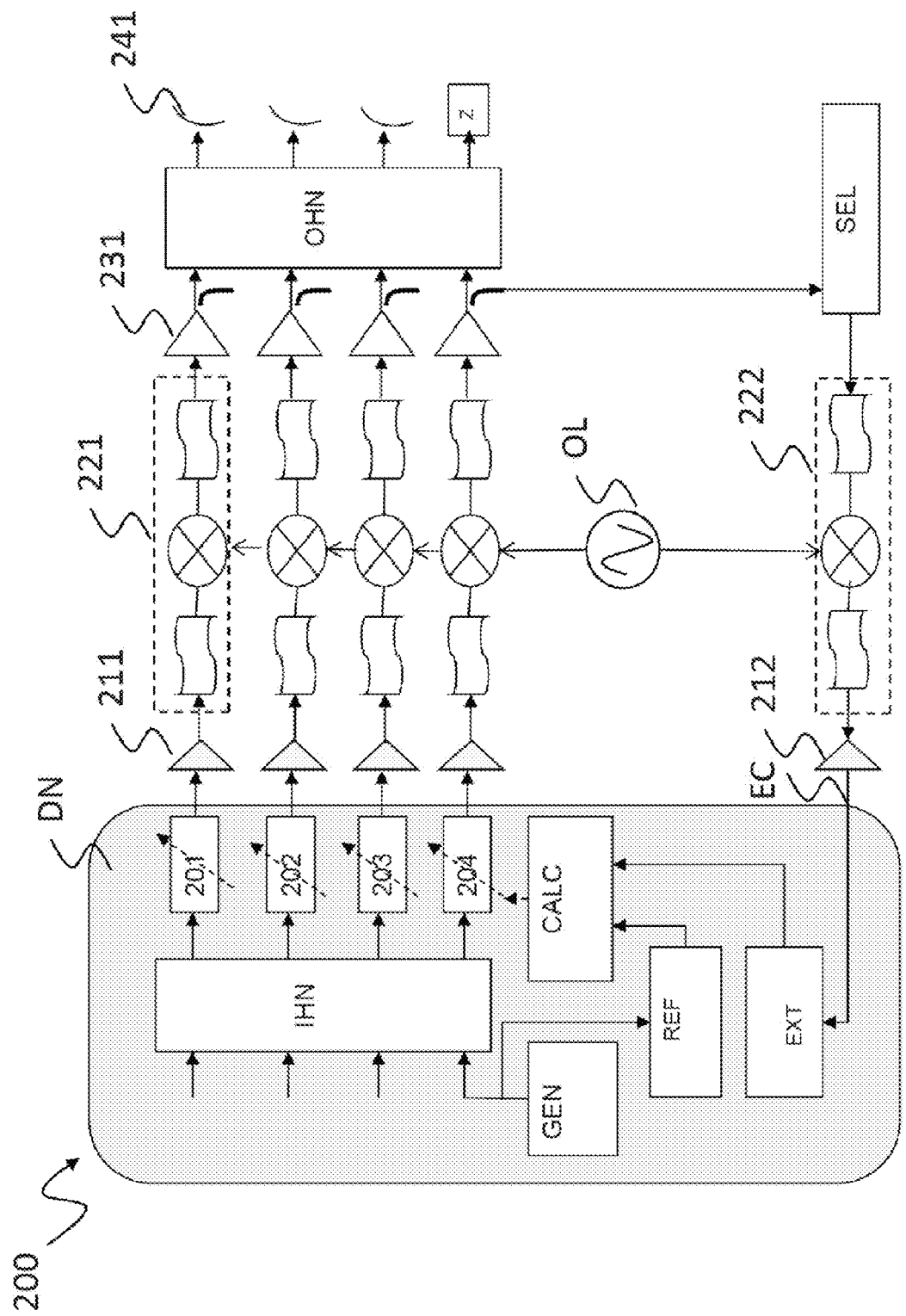

FIG. 2a describes an exemplary multichannel transmission system 200 according to a first embodiment of the invention.

The system 200 comprises some elements in common with the system of FIG. 1. In particular, the system 200 comprises a plurality of transmission channels (four channels in the example of FIG. 2a) each comprising an analog frequency conversion chain 221 and an amplifier 231. An output hybrid network OHN, preferably produced using waveguide technology, is connected to the outputs of the four amplifiers 231. Without departing from the scope of the invention, each frequency conversion chain 221 may also comprise one or more filters arranged between an amplifier 231 and an input of the output hybrid network OHN. In other words, the inputs of the output hybrid network OHN are connected directly or indirectly, via filters or other components, to the outputs of the amplifiers 231.

To correct defects in the frequency responses of the channels and to optimize isolation of the channels after amplification by the multiport amplifier, the invention implements a calibration mechanism which drives a set of digital filters (one filter per channel) 201-204 that have the function of correcting the signals in terms of phase and of amplitude so that, at the output of the output hybrid network OHN, the signals produced on the antennas 241 are amplified without frequency distortion induced by the frequency conversion chains 221 and without interference induced by the other channels. The digital filters are applied to the output signals of the input hybrid network IHN.

To that end, the invention consists in shifting the input hybrid network IHN, or more generally the function performed by the input hybrid network IHN, to the digital device DN upstream of the frequency conversion chains 221. One advantage of digitally embodying the input hybrid network is that it makes it possible to very precisely implement the inverse transfer function of the output hybrid network OHN which is perfectly known after manufacture. In addition, the output hybrid network OHN has a transfer function that is stable with time when it is manufactured using waveguide technology, which thus makes it possible to ensure strict reciprocity of the respective transfer functions of the digital input hybrid network IHN and of the output hybrid network OHN.

The signals to be transmitted are therefore produced directly on the inputs of the input hybrid network IHN, and are then equalized by a filter 201-204 configured to correct defects in the frequency responses of the channels in order to pair the channels with one another and to correct isolation defects in the multiport amplifier. The digital signals filtered by 201-204 are delivered as output from the digital device DN to digital-to-analog converters 211 and then to the frequency conversion chains 221.

To ensure calibration of the channels, the system 200 uses a dedicated input port of the input hybrid network IHN over which is injected a periodic calibration signal generated by a digital device GEN. The calibration signal is distributed over all of the channels, according to the transfer function of the input hybrid network IHN, and is then propagated at the output of the output hybrid network OHN over a single output which is connected to a load z. The other outputs of the output hybrid network OHN are connected to the antennas 241. Potential pairing defects in the functions located between the input and output hybrid networks lead to isolation defects and to reduced gains observable on the output ports.

The calibration signal is chosen so as to occupy the entire useful spectral band of the system. For example, it may be a wideband signal, or a narrowband signal the frequency of which is made to vary so as to sweep the entire useful spectral band over time according to a predefined temporal sequence.

The system 200 further comprises a selector SEL designed to successively and sequentially select each output of an amplifier 231 for each channel one after the other and periodically.

The signal taken from the output of an amplifier is then transmitted to a frequency conversion chain 222 which performs the inverse function of the frequency conversion chains 221 of each channel of the system. All of the frequency conversion chains 222 and 221 use the same local oscillator OL. An analog-to-digital converter 212 then digitizes the signal in order to provide it to the digital device DN over a calibration input EC.

A first component EXT or function of the digital device DN makes it possible to extract a measurement of the calibration signal from the signal available over the calibration input EC. The measurement of the calibration signal corresponds to the calibration signal which was injected at the input of the system and which, after having passed through the various components of the system, is subject to the same interference and defects as the useful signals.

This extraction is, for example, carried out by breaking down the received signal into consecutive time sequences of N samples, with N the period of the calibration signal. These sequences are then accumulated or averaged with one another. Since the useful signals are decorrelated from the calibration signal, this accumulation or averaging of the N sequences makes it possible to extract the calibration signal from the signal received over the calibration input EC, the contributions of the useful signals tending to cancel each other out. Other methods may be used to extract a known calibration signal, whether it is periodic or not periodic, among which may be cited, without being exhaustive, matched filtering, correlation or spectrum despreading methods.

When the calibration signal is extracted from the signal received over the calibration input EC, this signal is affected by the defects in the channel on which it was measured. It is then compared with the generated calibration signal which has potentially been delayed (by a digital delay line REF) in order to take into account the travel time of the signal through the system 200. An optimization algorithm makes it possible to determine the coefficients of a correction filter 201-204 on the basis of the comparison of the reference calibration signal and the calibration signal after extraction on the signal available over the calibration input, in order to minimize the difference between these two signals.

The comparison criterion depends on the optimization algorithm used; it may consist of a comparison in the time domain or in the frequency domain. In general, this criterion aims to minimize, directly or indirectly, in the time or frequency domain, the difference between these two signals.

The coefficients of the filter are determined so as to minimize the difference between the generated calibration signal and the calibration signal extracted from the measurement at the output of the amplifier of each channel. This pairing leads to the equalization of the frequency response of the channel in question including the frequency conversion chain and the elementary amplifier. Each filter is configured independently and the process is looped until it converges toward a steady state for which the defects are corrected and the measured calibration signal is identical to the generated calibration signal. When all of the channels have been calibrated relative to one and the same reference REF, they are then in fact paired with one another and the isolation of the signals on the output ports of the output hybrid network OHN is optimal.

Figure 2B:
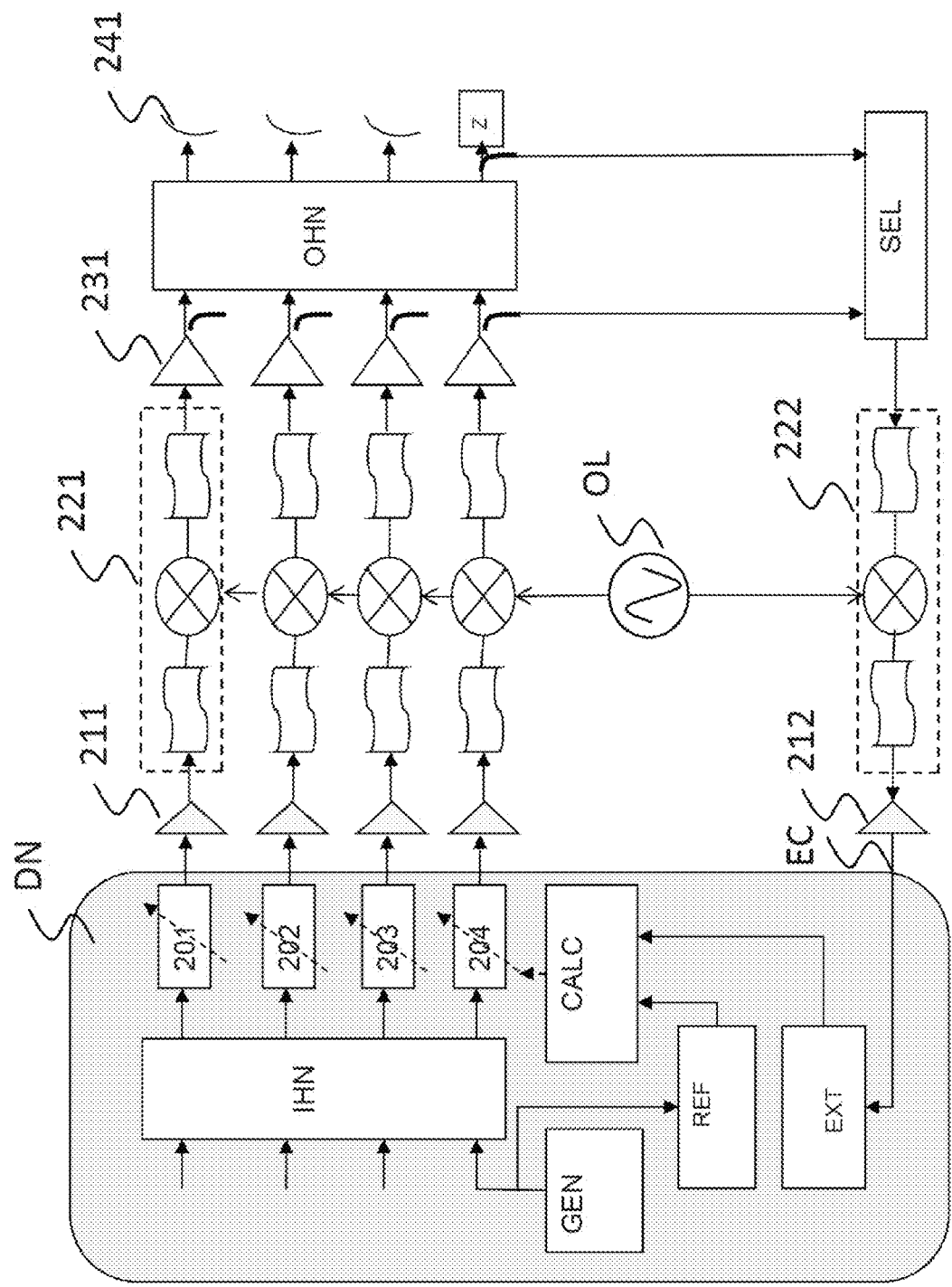

In one variant embodiment, the calibration signal may also be measured on the output of the output hybrid network OHN connected to the load z in order to evaluate the isolation of the channels by measuring the signal-to-noise ratio of the calibration signal relative to the power of the input signals. This variant is shown in FIG. 2b.

Figure 2C:
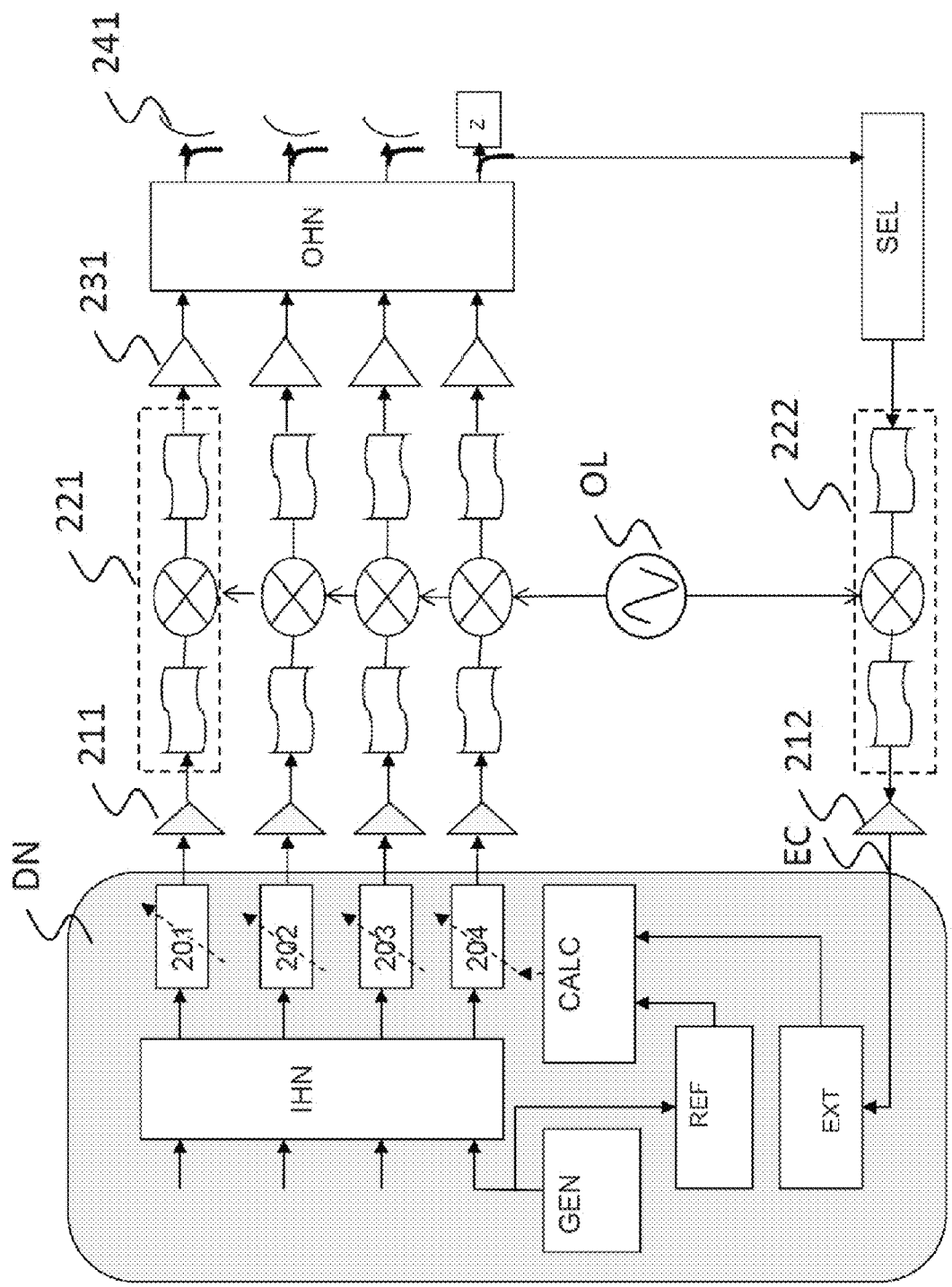

In another variant embodiment, the selector SEL no longer takes the signals from the input of the output hybrid network OHN but from the output, so as to take into account any defects in the output hybrid network OHN. This variant is shown in FIG. 2c.

Figure 2D:
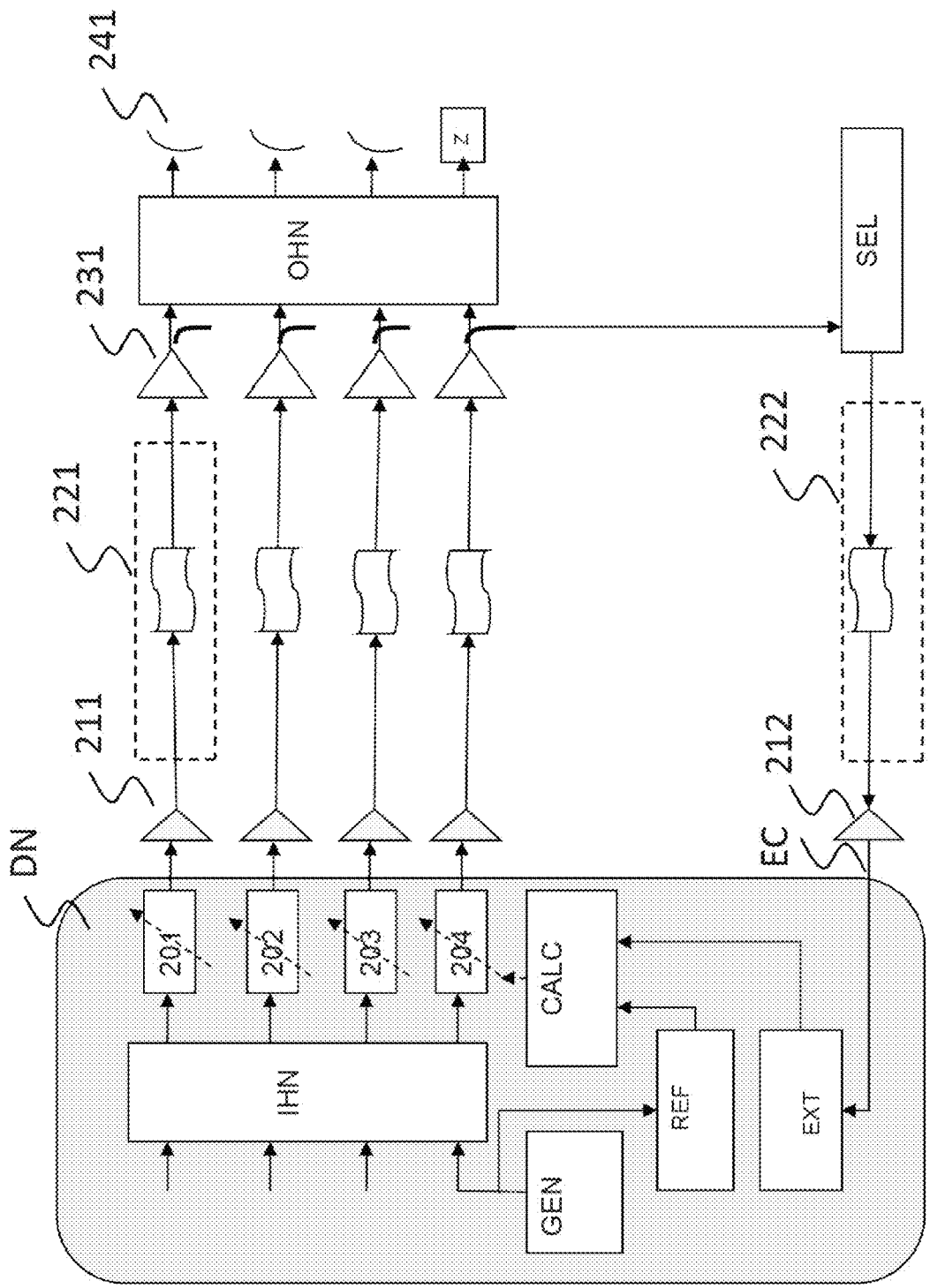

FIG. 2d describes another variant embodiment of the invention in which the frequency conversion function is performed jointly by the digital device, for example upstream of the input hybrid network IHN, and by the digital-to-analog converter generating spectral replicas, and by analog filtering in order to select a spectral replica. This conversion technique with frequency transposition is known as "undersampling" (or "bandpass sampling"). In this case, the radiofrequency chains 221 comprise one or more analog filters in order to filter the unwanted spectral components which are generated by the digital-to-analog converters 211. The inverse acquisition chain 222 comprises the same one or more filters as a direct radiofrequency chain 221. The filter of the acquisition chain 222 makes it possible to digitize the same frequency band as that of the radiofrequency chains 221. In general, the analog processing chain 222 is an acquisition chain for the analog signal taken by the selector SEL which makes it possible to select the desired frequency band before digitization.

The analog local oscillators are removed. The variant described in FIG. 2d is applicable for all of the variant implementations of the system, in particular those described in FIGS. 2b and 2c.

In all of the variant embodiments of the invention, the calibration mechanism implemented also results in compensating for any pairing defects in the digital-to-analog converters 211.

Now described is a number of exemplary implementations of the calculation CALC of the coefficients of the equalization filters 201-204 on the basis of the generated calibration signal GEN, on the one hand, and the calibration signal extracted EXT from a measurement on one of the channels of the system, on the other hand.

Each digital filter 201-204 is placed upstream of the analog transmission chains for which it is desired to compensate for deviations. The digital filters are independent of the optimization algorithm CALC used to calculate the coefficients. Various optimization algorithms are possible.

The optimization algorithm may operate in the time domain or in the frequency domain, iteratively/recursively or per block of samples. The optimization algorithms used may equally be: algorithms of least squares type such as LS (least squares), LMS (least mean squares), or RLS (recursive least squares) algorithms, algorithms using Fourier transforms (or FFT), covariances or correlations, or algorithms of CMA (constant modulus algorithm) type. Any of these exemplary optimization algorithms may be used to determine the coefficients of the correction filters 201-204.

Two examples of solutions for calculating the coefficients of the digital compensation filters are described below.

Figure 3:
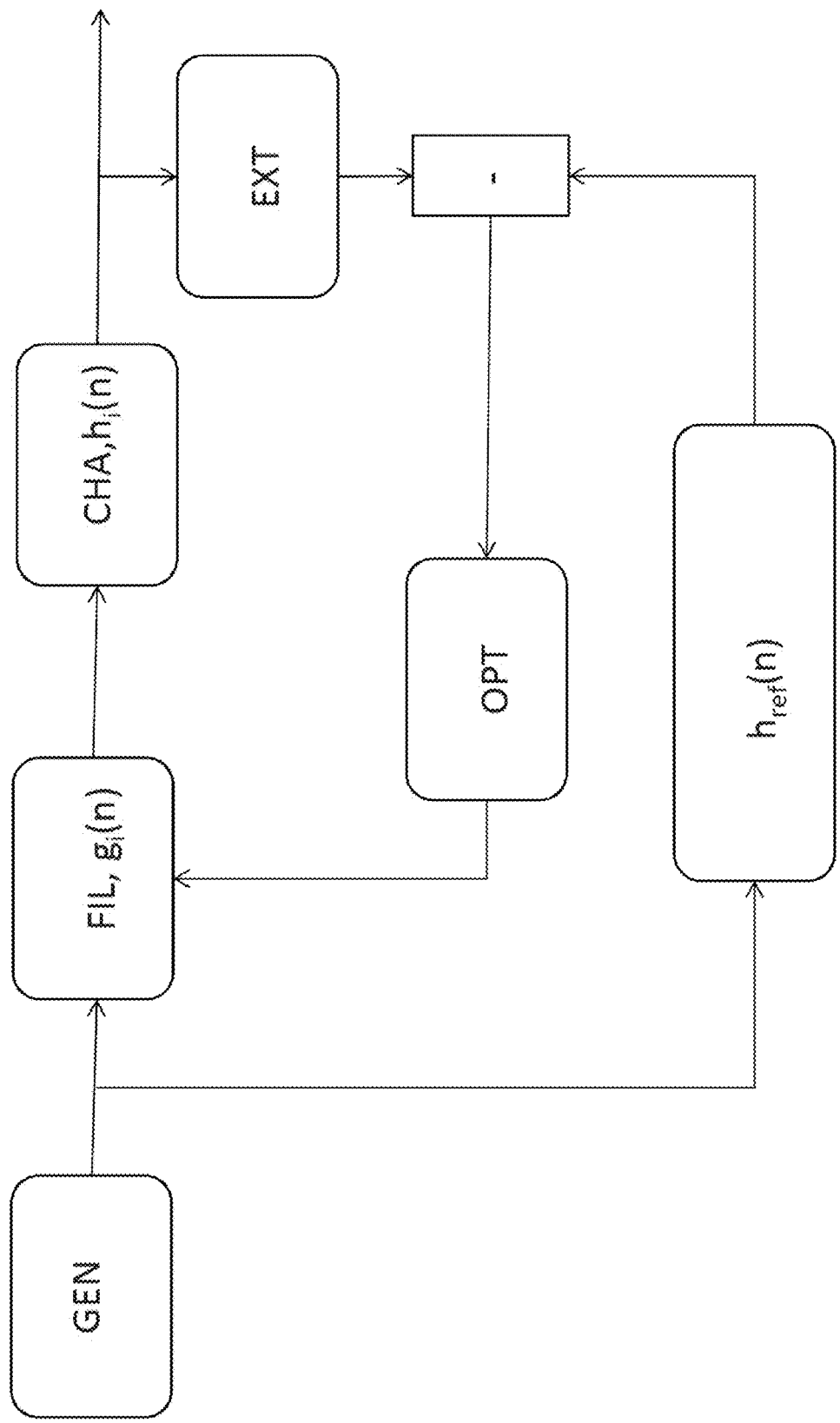

A first example is described for calibration in the time domain using a least squares algorithm. To illustrate this example, a block diagram of a model for calibrating a transmission channel is schematically shown in FIG. 3. According to this model, a calibration signal is generated by a generator GEN and transmitted over a transmission channel of the system. On each of the channels, a compensation filter FIL is applied with an impulse response $g_i(n)$ in the time domain. In addition, $h_i(n)$ denotes the impulse response of the analog processing chain CHA to be calibrated. The calibration signal is extracted, via an extraction function EXT, at the output of the processing chain and is then subtracted from the calibration signal at the output of a reference chain REF defined by the impulse response $h_{ref}(n)$, corresponding for example to a delay. On the basis of this difference or error signal, the optimization algorithm OPT calculates the impulse response of the filter $g_i(n)$, in other words its coefficients.

This algorithm OPT determines the coefficients of the filter which make it possible to minimize the power of the error between the calibration signal at the output of the reference chain and the calibration signal extracted at the output of the composite transfer function composed of the analog processing chain i to be calibrated $h_i(n)$ and the associated correction filter $g_i(n)$. If the power of the output error is minimized, then the composite transfer function tends toward the reference transfer function. The transfer function of the analog chain has therefore been equalized.

To determine the response of the filter, the optimization algorithm implements for example a method of LS or LMS type.

Figure 4:
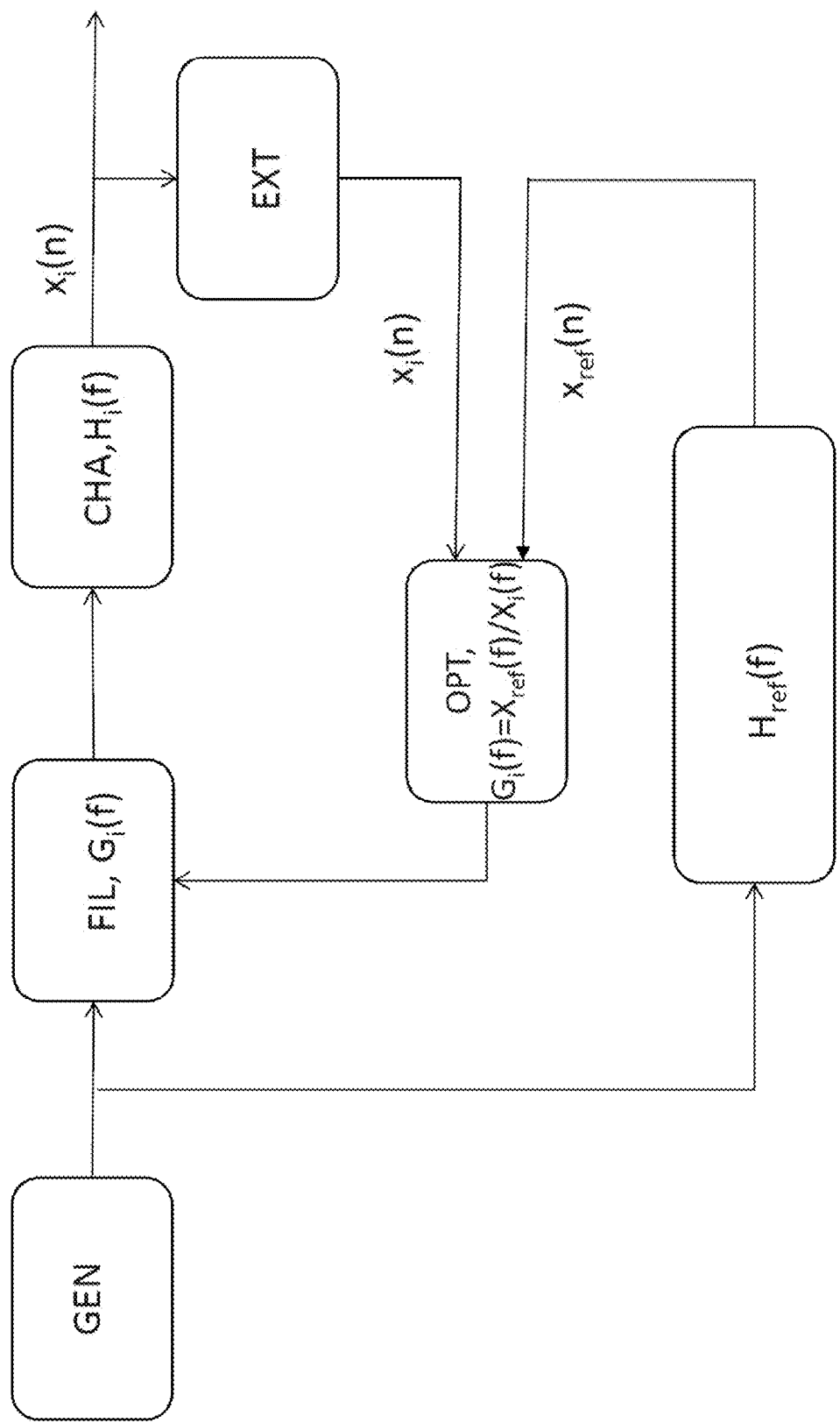

Another exemplary optimization algorithm is illustrated in FIG. 4. This is an optimization algorithm in the frequency domain. This algorithm uses a Fourier transform to determine the spectrum of the processed signals. In other words, the spectrum $X_i(f)$ of the signal $x_i(n)$ extracted at the output of the analog processing chain i is determined and the spectrum $X_{ref}(f)$ of the generated calibration signal to which the reference transfer function $H_{ref}(f)$ has been applied is determined. Assuming initialization with $G_i(f)=1$, it is then possible to determine the transfer function of the filter FIL $G_i(f)=X_{ref}(f)/X_i(f)$ then the coefficients of the filter via inverse Fourier transform applied to the transfer function $G_i(f)$.

Thus, after calibration, $G_i(f)$ is indeed obtained such that $G_i(f)*H_i(f)=H_{ref}(f)$ and the defects in the frequency response of the analog chain i are compensated for.

Figure 5:
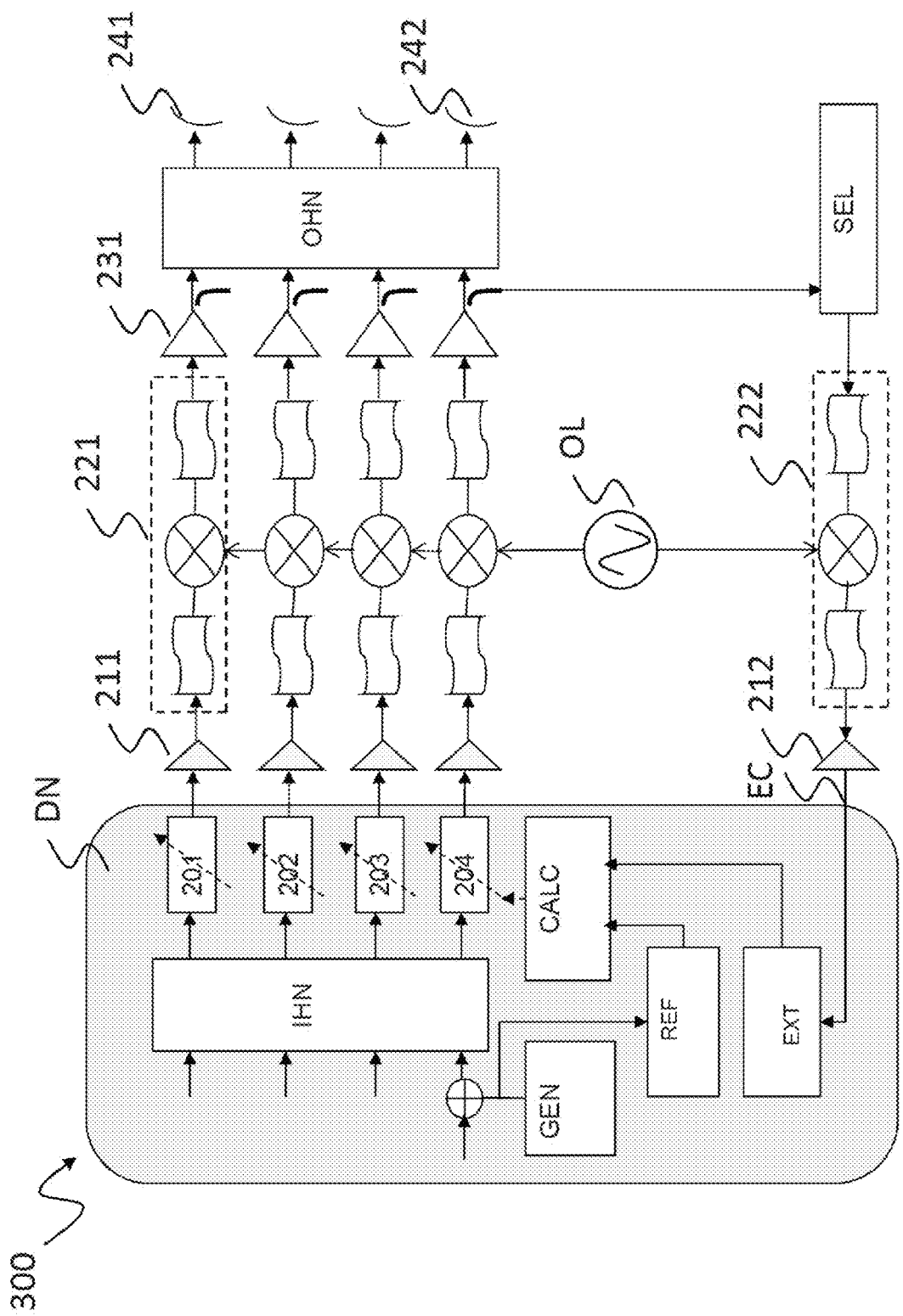

FIG. 5 schematically shows a first variant embodiment 300 of the system according to the invention.

According to this variant, the calibration signal is injected over a channel of the system by superposition onto the useful signal. In other words, in the system 300 described in FIG. 5, there is no longer an IHN input and OHN output dedicated to calibration. All of the outputs of the output hybrid network OHN are connected to an antenna 241,242 and all of the inputs of the system receive a useful signal. One advantage of this variant is that it allows the use of all of the inputs and outputs of the IHN and OHN hybrid networks without the need to dedicate two thereof for calibration.

One constraint to be observed for this variant is that the signal-to-noise ratio of the calibration signal has to be reduced so that it does not to interfere with the useful signal that is superposed onto it. To that end, the power of the calibration signal is reduced. One solution for improving the signal-to-noise ratio of the calibration signal consists in using a calibration signal with spread spectrum, at the cost of poorer frequency resolution.

FIG. 6 schematically shows a second variant 400 of the system according to the invention.

According to this variant, the calibration signal is replaced with the useful signal transmitted over an input channel of the system. This useful signal is stored in a memory MEM in order to serve subsequently as a—non-periodic—calibration signal used in order to be compared with the signal extracted from the signal taken from the output of a processing channel.

This variant requires that the useful signal which replaces the calibration signal be decorrelated from the other useful signals in order to be able to extract it from the signal taken from the output of each channel.

The system according to the invention may be implemented using hardware and/or software components. The software elements may be present in the form of a computer program product on a computer-readable medium, which medium may be electronic, magnetic, optical or electromagnetic. The hardware elements may be present, in full or in part, notably in the form of dedicated integrated circuits (ASICs) and/or configurable integrated circuits (FPGAs) and/or in the form of a digital signal processor DSP and/or in the form of a graphics processor GPU, and/or in the form of a microcontroller and/or in the form of a general-purpose processor, for example.

In particular, the digital device DN may be implemented by a set of dedicated integrated circuits (ASICs) and/or configurable integrated circuits (FPGAs) and/or a digital signal processor DSP, or a general-purpose processor, a multicore processor, or a microcontroller. The other components of the system, apart from the digital device DN, are analog components.

In particular, the invention has the following advantages. It makes it possible to perform dynamic calibration of a multichannel transmission system without interrupting the service provided by the system, that is to say simultaneously with the transmission of the useful signals.

Unlike the solutions of the prior art, the invention makes it possible to correct not only isolation defects in a multiport amplifier but also defects in the frequency responses of the analog chains of the system.

The invention makes it possible, by virtue of the use of ports dedicated to calibration, to produce the calibration mechanism with a high degree of precision and without affecting the service. Indeed, the power of the calibration signal may be high since the calibration signal does not interfere with the useful signals at the output of the system. The calibration signal is not radiated.

The implementation of a digital input hybrid network allows precise realization of the transfer function of this network as being equal to the inverse of the transfer function of the output hybrid network. Thus, reciprocity defects between the two transfer functions are minimized.

The use of digital filters to compensate for defects in the frequency responses of the analog chains, associated with a calibration signal that occupies the entire spectral band of the system, makes it possible to calibrate the system throughout the entire frequency band with very fine frequency resolution.

The invention claimed is:

1. A multichannel transmission system comprising a digital device configured to implement a multiple-input, multiple-output input hybrid network and a distinct equalization filter for each output of the input hybrid network, the system further comprising:
   for each output of the digital device, a digital-to-analog converter followed by a radiofrequency analog processing chain, comprising at least one analog filter, and by an amplifier,
   an output hybrid network, each input of which is connected to an output of a respective amplifier,
   a radiofrequency analog acquisition chain comprising at least one analog filter connected on one hand, alternately, to the output of each amplifier via a selector, and on another hand to a calibration input of the digital device via an analog-to-digital converter,
   the digital device being further configured to:
      generate a calibration signal on an input of the input hybrid network, wherein the calibration signal occupies an entire spectral band of the system,
      generate a payload signal on all other inputs of the input hybrid network,
      extract, from a signal received on the calibration input, a measurement of the calibration signal,
      successively determine a response of each equalization filter so as to minimize a difference between the generated calibration signal and the measured calibration signal, the selector being connected successively to the output of each amplifier before the inputs of the output hybrid network.

2. The multichannel transmission system as claimed in claim 1, wherein the input hybrid network is configured to receive the calibration signal on a calibration input and a payload signal on the other inputs of the input hybrid network and the output hybrid network comprises a calibration output connected to a load and the other outputs of the output hybrid network are connected to one or more antennas.

3. The multichannel transmission system as claimed in claim 1, wherein the calibration signal is superposed onto a payload signal on an input of the input hybrid network.

4. The multichannel transmission system as claimed in claim 1, wherein the calibration signal is a wideband signal or a narrowband signal having a frequency band that varies with time throughout the entire frequency band of the system.

5. The multichannel transmission system as claimed in claim 1 wherein the calibration signal is periodic and the extraction of a measurement of the calibration signal is achieved by performing a coherent temporal accumulation of the signal received on the calibration input.

6. The multichannel transmission system as claimed in claim 1, wherein the calibration signal is equal to a payload signal generated on an input of the input hybrid network and saved in a memory.

7. The multichannel transmission system as claimed in claim 1, wherein each equalization filter is configured to correct, over an entire frequency band of the system, the output signals of the input hybrid network in terms of amplitude and of phase so as to correct a pairing and isolation defects in different channels of the multichannel transmission system.

8. The multichannel transmission system as claimed in claim 1, wherein a transfer function of the input hybrid network is determined so as to be an inverse of a transfer function of the output hybrid network.

9. The multichannel transmission system as claimed in claim 1, wherein each radiofrequency analog processing chain comprises a frequency transposition device for transposing an analog signal from a first frequency to a second frequency and the radiofrequency analog acquisition chain comprises an inverse frequency transposition device for transposing an analog signal from the second frequency to the first frequency.

10. A satellite payload comprising the multichannel transmission system as claimed in claim 1 and at least one antenna or antenna array connected at an output of said system.

* * * * *